(12) United States Patent  
Abe (10) Patent No.: US 8,766,857 B2  
(45) Date of Patent: Jul. 1, 2014

(54) WIRELESS COMMUNICATION TERMINAL, SHIELD CASE, AND METHOD OF MANUFACTURING CASE BODY

(75) Inventor: Yasuhiro Abe, Kanagawa (JP)

(73) Assignee: KYOCERA Corporation, Kyoto (JP)

( * ) Notice: Subject to any disclaimer, the term of this patent is extended or adjusted under 35 U.S.C. 154(b) by 1259 days.

(21) Appl. No.: 12/088,364

(22) PCT Filed: Sep. 27, 2006

(86) PCT No.: PCT/JP2006/319194  
§ 371 (c)(1),  
(2), (4) Date: Jul. 30, 2009

(87) PCT Pub. No.: WO2007/037283  
PCT Pub. Date: Apr. 5, 2007

(65) Prior Publication Data  
US 2010/0033384 A1 Feb. 11, 2010

(30) Foreign Application Priority Data  
Sep. 27, 2005 (JP) ................................. 2005-279423

(51) Int. Cl.  
*H01Q 1/24* (2006.01)
(52) U.S. Cl.  
USPC ........................................ 343/702; 455/575.1
(58) Field of Classification Search  
USPC .......................................... 343/702; 455/572  
See application file for complete search history.

(56) References Cited

U.S. PATENT DOCUMENTS

| 5,142,698 | A | * | 8/1992 | Koga et al. ..................... 455/327 |
| 5,392,461 | A | * | 2/1995 | Yokoyama .................... 455/90.2 |
| 5,731,963 | A | * | 3/1998 | Heiss et al. .................... 361/814 |
| 5,955,752 | A | | 9/1999 | Fukaya et al. |
| 6,236,366 | B1 | | 5/2001 | Yamamoto et al. |
| 7,102,896 | B2 | * | 9/2006 | Ajioka et al. .................. 361/816 |
| 2002/0022459 | A1 | | 2/2002 | Kobayashi |

(Continued)

FOREIGN PATENT DOCUMENTS

| JP | H01-311605 A | 12/1989 |
| JP | H02-031706 A | 8/1990 |

(Continued)

OTHER PUBLICATIONS

Notification of Reasons for Refusal dated Nov. 20, 2010 issued for counterpart Japanese Application No. 2009-127336.

(Continued)

*Primary Examiner* — Jacob Y Choi  
*Assistant Examiner* — Kyana R Robinson  
(74) *Attorney, Agent, or Firm* — Procopio, Cory, Hargreaves & Savitch LLP (57) ABSTRACT

There are provided a first circuit substrate 22 on which an antenna 32 and electronic components are arranged, a case body 24 that is molded of a non-conductive material and that is attached to the first circuit substrate 22 so that the case body 24 overlaps the first circuit substrate 22 in the thickness direction of the first circuit substrate 22, and a housing 8 including the first circuit substrate 22 and the case body 24 in the housing 8. The case body 24 comprises a conductive layer formed on the surface of the case body 24, except for an antenna opposing area S where the case body 24 overlaps the antenna 32 in the thickness direction of the first circuit substrate 22.

13 Claims, 8 Drawing Sheets

(56) References Cited

U.S. PATENT DOCUMENTS

| | | |
|---|---|---|
| 2003/0063036 A1 | 4/2003 | Sato et al. |
| 2004/0027298 A1 | 2/2004 | Iguchi et al. |
| 2004/0108959 A1 | 6/2004 | Park et al. |
| 2005/0078038 A1 | 4/2005 | Takaki et al. |
| 2007/0051603 A1* | 3/2007 | Hakunti et al. ............ 200/310 |

FOREIGN PATENT DOCUMENTS

| | | |
|---|---|---|
| JP | 02-305002 | 12/1990 |
| JP | H08-223260 A | 8/1996 |
| JP | 09-167908 | 6/1997 |
| JP | H10-079623 A | 3/1998 |
| JP | 10-163748 | 6/1998 |
| JP | H11-004118 A | 1/1999 |
| JP | H11-275196 A | 10/1999 |
| JP | 11-312912 | 11/1999 |
| JP | 2002-319808 | 10/2002 |
| JP | 2003-101623 | 4/2003 |
| JP | 2003-347835 | 12/2003 |
| JP | 2004-096209 | 3/2004 |
| JP | 2005-051576 | 2/2005 |

OTHER PUBLICATIONS

Translation of Office Action issued in Korean Patent Application No. 10-2008-7007463 dated Feb. 24, 2010.

* cited by examiner

FIG. 1

WIRELESS COMMUNICATION TERMINAL, SHIELD CASE, AND METHOD OF MANUFACTURING CASE BODY

CROSS-REFERENCE TO RELATED APPLICATION

This application is the U.S. national stage application of international application serial number PCT/JP2006/319194, filed 27 Sep. 2006, which claims priority to Japanese patent application no. 2005-279423, filed 27 Sep. 2005, each of which is incorporated herein by reference in its entirety.

FIELD OF THE INVENTION

Technical Field

The present invention relates to a wireless communication terminal having an antenna provided in the housing thereof, a shield case housed within the housing of the wireless communication terminal, and a method of manufacturing a case body.

BACKGROUND OF THE INVENTION

Background Art

Some wireless communication terminals, such as mobile phones, are configured in such a manner that communication, such as a phone call, is performed after a user extends a telescopic antenna installed in the wireless communication terminal toward the outside in the direction of its length.

However, in such a telescopic antenna, since the length of the wireless communication terminal is increased by a length corresponding to the extension thereof toward the outside, this is an obstacle to realizing compactness of the wireless communication terminal. For this reason, there is a wireless communication terminal (for example, see Japanese Unexamined Patent Application Publication No. 2003-101623; Japanese Unexamined Patent Application Publication No. 11-312912; and Japanese Unexamined Patent Application Publication No. 10-163748) in which, in place of such an antenna that extends toward the outside, a built-in antenna is provided inside the housing, so that a compact state can be maintained also during communication.

DISCLOSURE OF INVENTION

Problems to be Solved by the Invention

However, in a wireless communication terminal in which a built-in antenna as disclosed in Japanese Unexamined Patent Application Publication No. 2003-101623; Japanese Unexamined Patent Application Publication No. 11-312912; and Japanese Unexamined Patent Application Publication No. 10-163748 is disposed, this antenna is arranged in the vicinity of a ground (metal part to which a reference potential is applied) in a circuit substrate inside the housing. As a result, a problem arises in that the gain of an antenna is deteriorated in comparison with that of a wireless communication terminal in which the telescopic antenna is installed.

Accordingly, in view of the above-described problems, an object of the present invention is to provide a wireless communication terminal capable of preventing the deterioration of the gain of a built-in antenna, a shield case, and a method of manufacturing a case body.

Means for Solving the Problems

In order to achieve the above-described object, according to the present invention, a wireless communication terminal comprises a first circuit substrate on which an antenna and an electronic component are arranged; a case body molded of a non-conductive material, the case body attached to the first circuit substrate so that the case body overlaps the first circuit substrate in the thickness direction of the first circuit substrate; and a housing including the first circuit substrate and the case body therein, wherein the case body comprises a conductive layer formed on the surface thereof, the surface being except for an antenna opposing area where the case body overlaps the antenna in the thickness direction of the first circuit substrate.

In the wireless communication terminal according to one aspect of the present invention, the case body further comprises a flat plate part parallel to the first circuit substrate in a state in which the case body is attached to the first circuit substrate, the flat plate part containing the antenna opposing area, and a rib formed to have a height in a direction from the flat plate part to the first circuit substrate side, wherein the rib is not formed in at least a section in the peripheral edge of the antenna opposing area or is formed intermittently.

The wireless communication terminal according to one aspect of the present invention, further comprises a key sheet having a key top, disposed at a position opposite to the first circuit substrate side of the flat plate part. The wireless communication terminal according to one aspect of the present invention, further comprises a second circuit substrate having a metal dome pressed by the key top, the second substrate being arranged between the key sheet and the flat plate part, wherein the metal dome is positioned so that the metal dome does not overlap the antenna in the thickness direction of the first circuit substrate.

In order to achieve the above-described object, according to one aspect of the present invention, a shield case comprises a flat plate part; and a rib formed to have a height in a direction from the flat plate part to one of the surface sides, the rib comprising a non-conductive material, wherein the flat plate part and the rib have a conductive layer formed thereon except for at least a predetermined area.

According to the shield case of the present invention, the flat plate part and the rib are integrally formed. In order to achieve the above-described object, according to one aspect of the present invention, a method of manufacturing a case body mounted on a circuit substrate on which an antenna and an electronic component are arranged, the method including a step of forming a case body from a non-conductive material, the case body having a flat plate part and a rib having a height at a place excluding at least a portion of a peripheral edge portion of a predetermined area on a first surface of the flat plate part; a step of masking both the first surface and a second surface on the reverse side of the first surface by using a non-rib portion of the peripheral edge portion in the predetermined area; a step of forming a conductive layer on the case body; and a step of removing the mask.

Advantages

According to aspects of the present invention, the wireless communication terminal, the shield case, and the method of manufacturing a case body, described above, make it possible to prevent the gain of a built-in antenna from being deteriorated.

BEST MODES FOR CARRYING OUT THE INVENTION

Embodiments of a wireless communication terminal, a shield case, and a method of manufacturing a case body according to the present invention will be described below specifically with reference to the drawings.

FIGS. 1 to 6 are views for reference used to illustrate a folding-type mobile phone 2 (corresponding to a wireless communication terminal), a case body 24 (corresponding to a shield case), and a method of manufacturing the case body 24 according to a first embodiment of the present invention.

Figure 1:
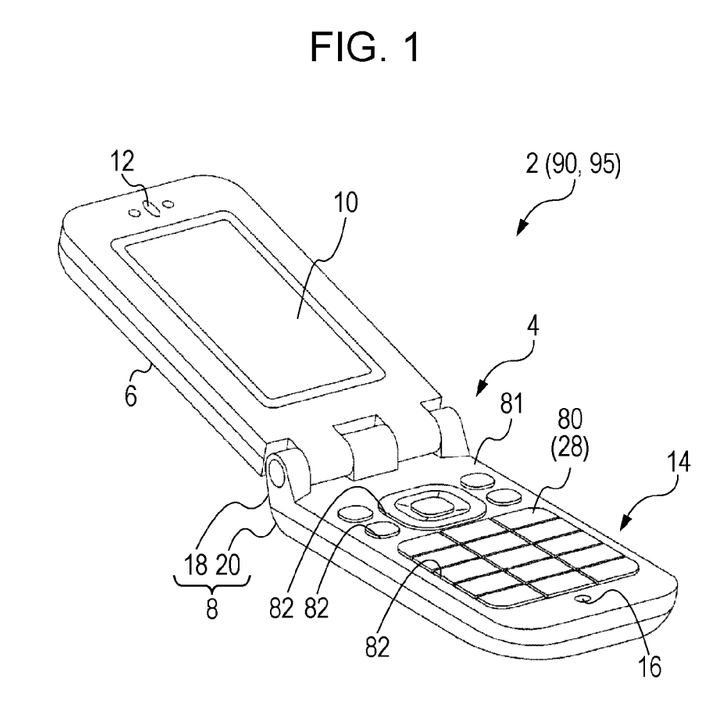
FIG. 1 is a perspective view showing folding-type mobile phones 2, 90, and 95 according to various embodiments of the present invention.

As shown in FIG. 1, the folding-type mobile phone 2 according to this embodiment comprises a first housing 6 and a second housing 8 that are rotatably connected to each other via a hinge 4. The first housing 6 has a display unit 10 and a speaker 12, and the speaker 12 is arranged at a position near the end portion on a side opposite to the hinge 4 in the length direction of the first housing 6. Furthermore, the second housing 8 has an operation unit 14 and a microphone 16, and the microphone 16 is arranged at a position near the end portion on a side opposite to the hinge 4 in the length direction of the second housing 8.

Figure 2:
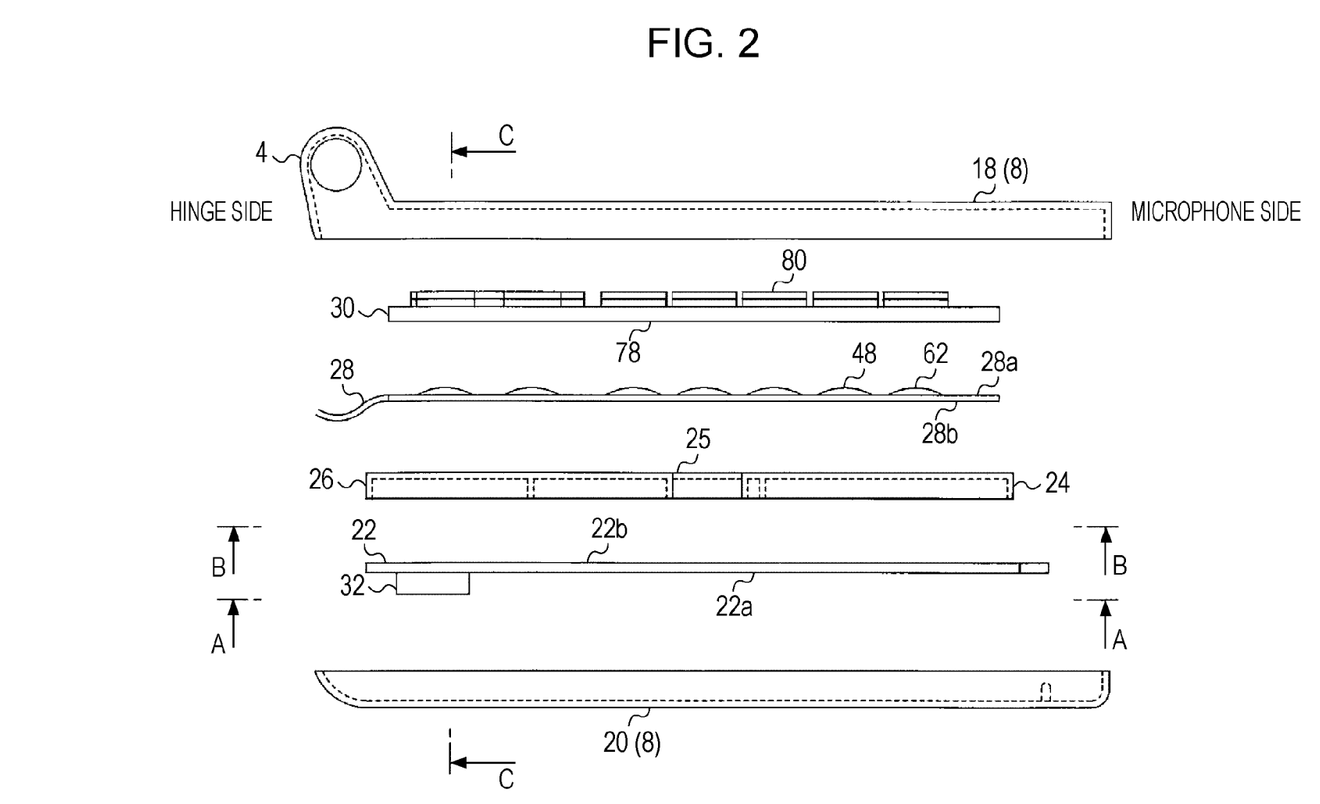
FIG. 2 is an exploded side view showing a state in which an upper case 18 and a lower case 20 of a second housing 8, shown in FIG. 1, of the folding-type mobile phone 2 according to a first embodiment of the present invention, a rigid substrate 22, a case body 24, a key FPC 28, a key sheet 30, and an antenna 32 housed inside the second housing 8 are assembled.

The second housing 8 comprises an upper case 18 having an operation unit 14 and a lower case 20 on the reverse side thereof. as shown in FIG. 2, in the internal space formed between the upper case 18 and the lower case 20, starting in sequence from the lower case 20, a rigid substrate 22 (corresponding to a first circuit substrate or a circuit substrate), a case body 24, a key FPC (Flexible Printed Circuit) 28 (corresponding to a second circuit substrate), and a key sheet 30 are housed.

On a first surface 22a on the lower case 20 side of the rigid substrate 22 and on a second surface 22b on a side opposite to the first surface 22a, various kinds of electronic components (not shown) are arranged. Furthermore, on the first surface 22a of the rigid substrate 22, a built-in antenna 32 is fixed.

Figure 3:
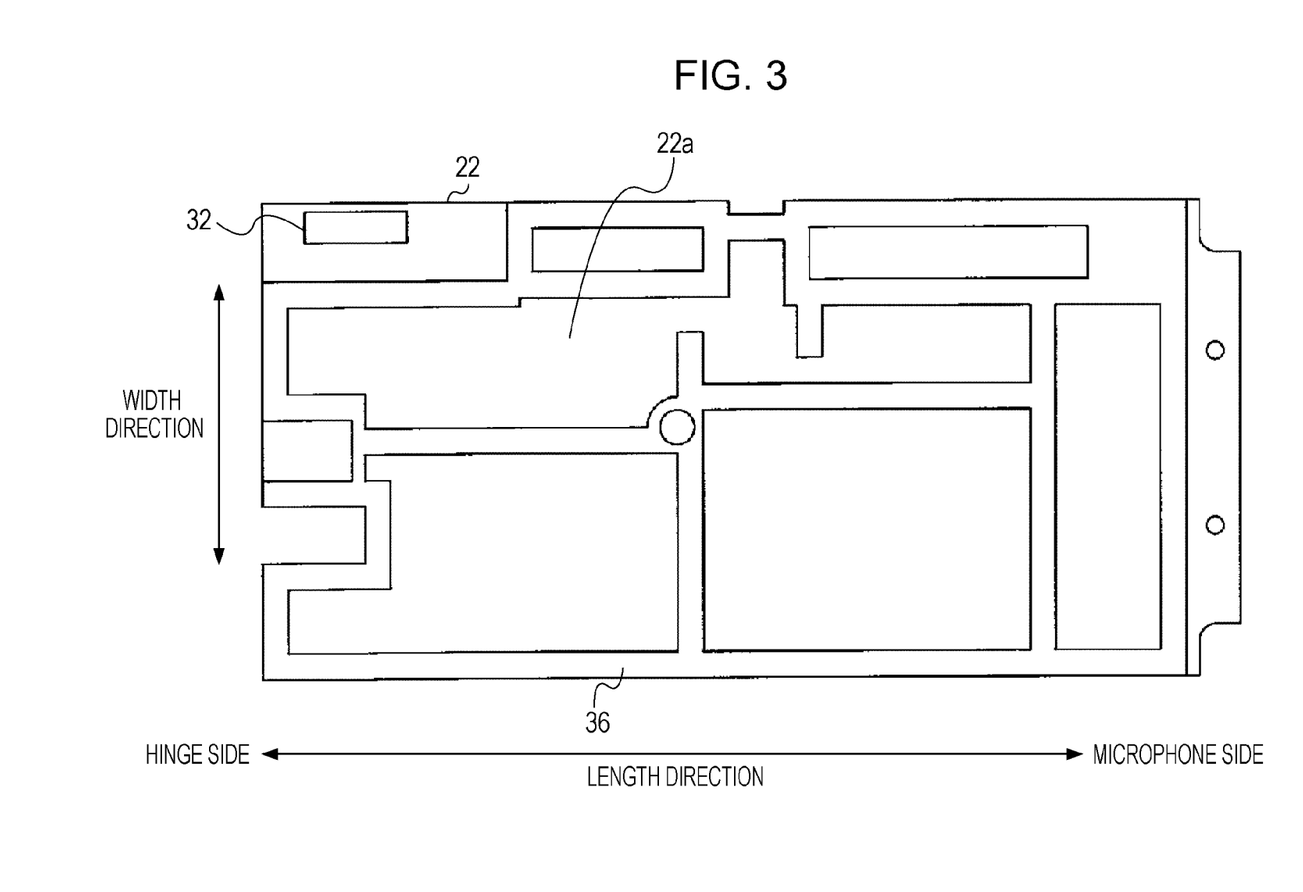
FIG. 3 is a view taken along line A-A of the rigid substrate 22 shown in FIG. 2.

This antenna 32, as shown in FIG. 3, is arranged in an end portion on the hinge 4 side along the length direction in the rigid substrate 22 (in the direction in which the hinge 4 side and the microphone 16 side are connected), the end portion being one of the end portions in the width direction. The rigid substrate 22 is positioned so that a reference potential pattern 36 on the first surface 22a to which the reference potential is applied does not overlap the antenna 32. The antenna 32 is circuit-connected with a conductive pattern (not shown) formed on the first surface 22a and is supplied with power through the conductive pattern.

Figure 4:
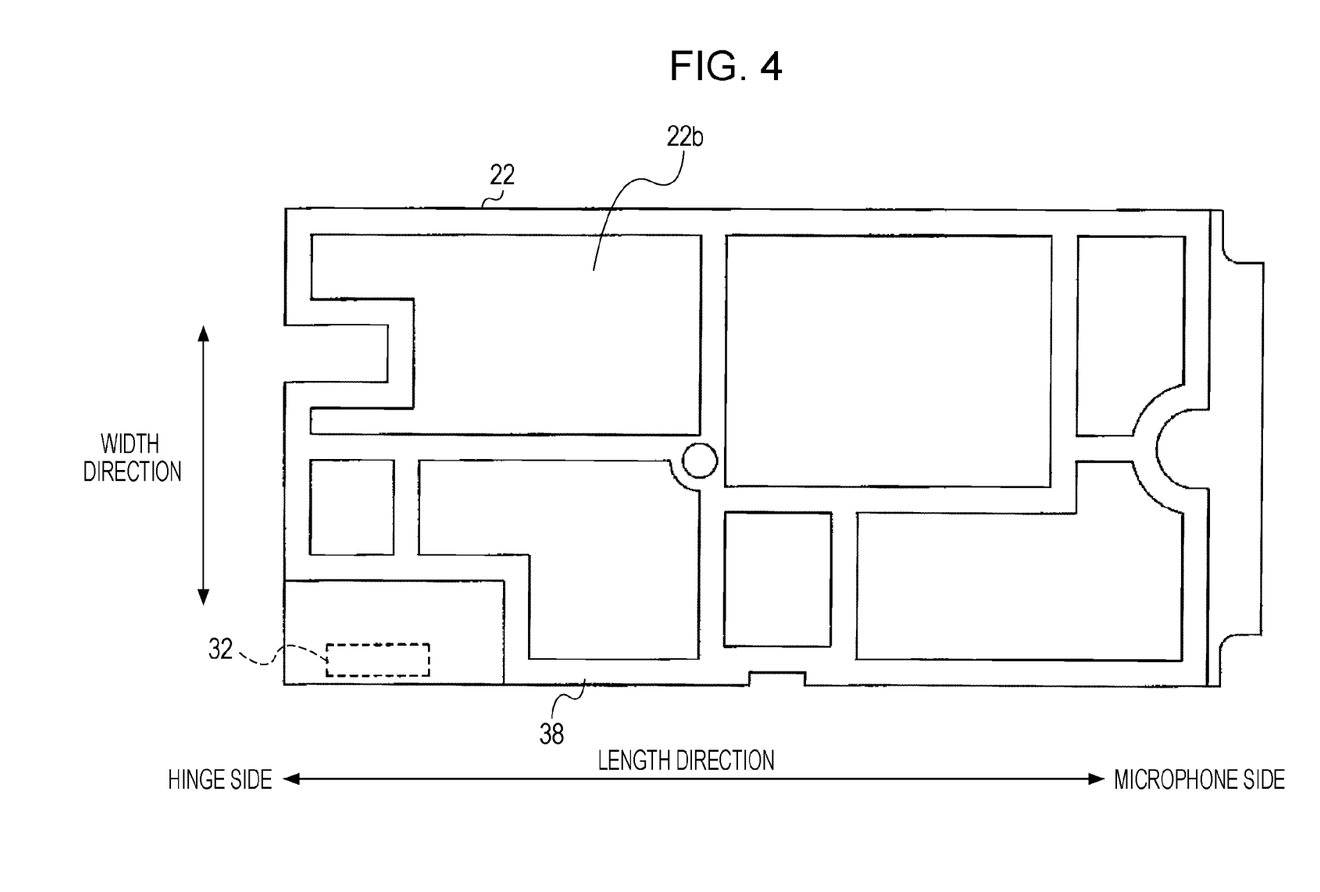
FIG. 4 is a back view of the rigid substrate 22 shown in FIG. 3.

As shown in FIG. 4, also, the rigid substrate 22 is positioned so that the reference potential pattern 38 on the second surface 22b to which the reference potential is applied does not overlap the antenna 32 in the thickness direction of the rigid substrate 22.

Furthermore, if the rigid substrate 22 is a multilayered substrate, although not shown in the figures, a reference potential pattern is positioned so that the reference potential pattern does not overlap the antenna 32 in the internal layers thereof. Furthermore, a conductive pattern, in addition to a reference potential pattern, is positioned so that the conductive pattern including the surface layer and the internal layer of the rigid substrate 22 does not overlap the antenna 32 except for a power feeding portion to the antenna 32.

Figure 5:
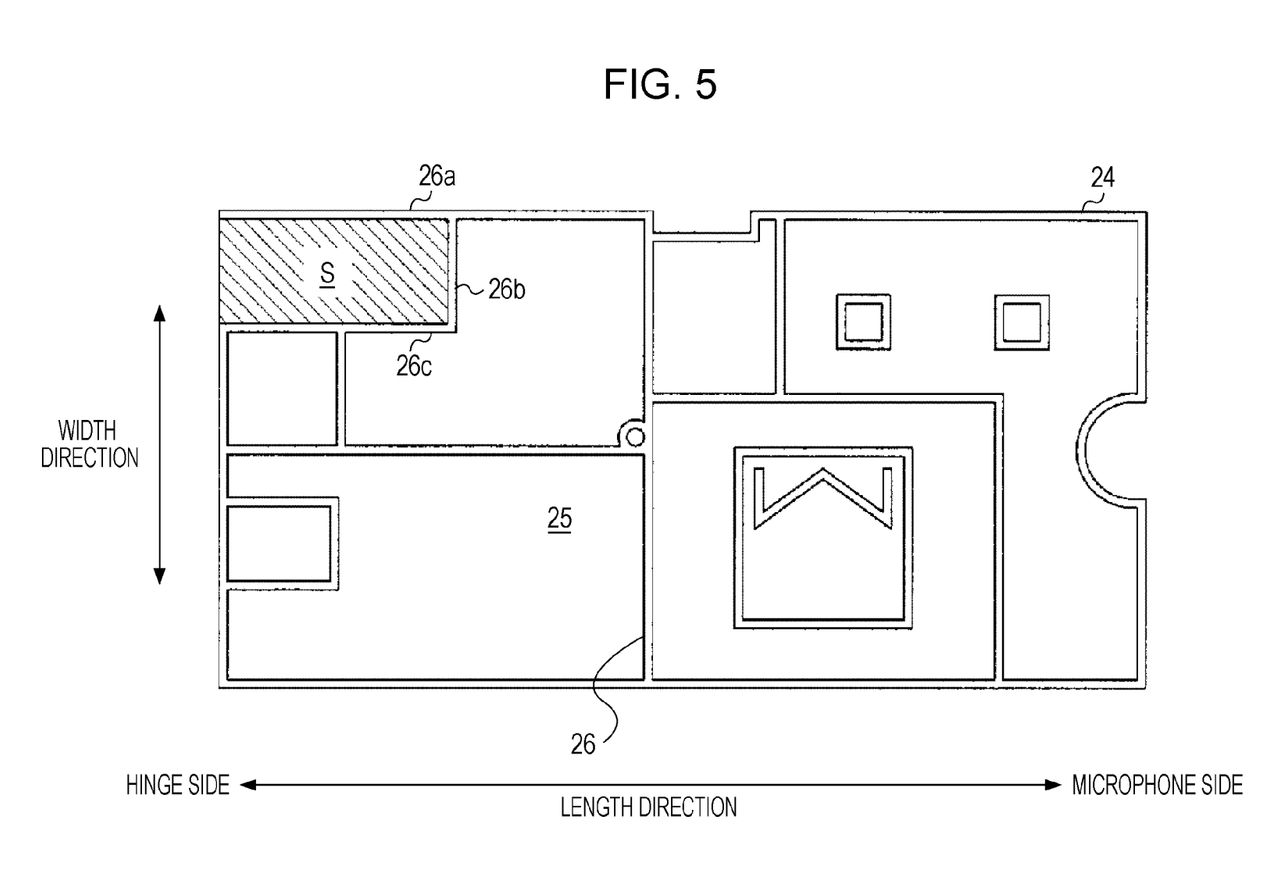
FIG. 5 is a view taken along line B-B in FIG. 2, showing the case body 24 of the folding-type mobile phone 2 according to a first embodiment.

Next, as shown in FIG. 5, the case body 24 comprises a flat plate part 25 having an almost flat surface whose planar shape is substantially a rectangle, and a rib 26 formed to have a height from the flat plate part 25 toward the rigid substrate 22 side (in FIG. 5, the front side at right angles to the paper surface). The rib 26 is formed over substantially the entire circumference of the edge portion of the flat plate part 25 and at a predetermined position in the inside of the plane shape.

As shown in FIG. 2, the case body 24 is attached to the rigid substrate 22 so that the flat plate part 25 is arranged in parallel with the rigid substrate 22, and the end surface in the height direction of the rib 26 is brought into contact with the second surface 22b of the rigid substrate 22. The case body 24 covers electronic components, such as a high-frequency circuit (not shown), on the second surface 22b of the rigid substrate 22 to form a closed space between the second surface 22b and the case body 24.

The flat plate part 25 of the case body 24 has an antenna opposing area S shown in FIG. 5 (in the figure, a rectangular shaded area) facing the antenna 32 in the thickness direction of the rigid substrate 22. That is, the antenna opposing area S overlaps the antenna 32 in the thickness direction of the rigid substrate 22. In the peripheral edge of the antenna opposing area S, a rib 26a formed in the edge portion of the flat plate part 25 in parallel with the length direction of the flat plate part 25, and a rib 26b formed in parallel with the width direction of the flat plate part 25 inside the planar flat plate part 25 and a rib 26c formed in parallel with the length direction of the flat plate part 25 inside the planar flat plate part 25 are arranged. The rib 26 is not formed in a section of the flat plate part 25. The section corresponds to the side other than the three sides corresponding to the ribs 26a, 26b, and 26c among the four sides of the peripheral edge of the antenna opposing area S.

Furthermore, as the core material of the case body 24, a hard and non-conductive synthetic resin material is used, and a metallic conductive layer is formed by a vapor deposition method over almost the entire area of the obverse and reverse surfaces of the core material. When the case body 24 is inserted between the upper case 18 and the lower case 20, the conductive layer on the obverse surface contacts a contact point provided in the reference potential pattern 38 (see FIG. 4) on the second surface 22b of the rigid substrate 22 to be electrically connected to the reference potential pattern 38, thereby having the same potential as that of the reference potential pattern 38. Therefore, the case body 24 functions as a shield case except for the antenna opposing area S.

That is, the case body 24 serving as a shield case prevents external noise from affecting a plurality of electronic components (not shown) on the second surface 22b of the rigid substrate 22, and also prevents noise generated from each of electronic components (not shown) from affecting each other and sneaking into the antenna 32.

For example, the case body 24 absorbs noise from a high-frequency circuit, such as an RF (Radio Frequency) module (not shown) that generates a wireless frequency, arranged on the second surface 22b of the rigid substrate 22 shown in FIG. 2, so as to prevent noise from affecting a baseband chip set (not shown) or the like arranged on the second surface 22b of the rigid substrate 22.

Furthermore, in the case body 24, a conductive layer is not formed on each of the obverse and reverse surfaces in the antenna opposing area S (see FIG. 5) in the flat plate part 25. in order that a conductive layer is not formed on each of the obverse and reverse surfaces of the antenna opposing area S in the manner described above, when a conductive layer is formed by a vapor deposition method or the like on the entire surface of the core material of the case body 24, masking is performed in advance on the obverse and reverse surfaces of the antenna opposing area S. After the conductive layer is formed on the area of the entire surface, the mask is removed together with the conductive layer on the mask. As a result, the conductive layer can be made to remain in places where masking has not been performed.

Such masking can be performed, for example, by attaching a tape having an adherent layer on one of the surfaces or by applying a paint which is in a liquid state at first and can be easily peeled off after being solidified.

As another masking method in which a tape or a paint for masking is not used, although not shown in the figure, a method of using a masking member that has slits of approximately the same clearance width as the thickness of the flat plate part 25 and that is approximately U-shaped in cross section may be used. that is, this masking member (not shown) is mounted so that the obverse and reverse surfaces of the antenna opposing area S are pinched toward the inside of the slit from the non-rib side in the antenna opposing area S, then, a conductive layer is formed on the area of the entire surface of the case body 24. If the masking member is removed after the conductive layer is formed, it is possible to prevent a conductive layer from being formed on both the obverse and reverse surfaces in the antenna opposing area S, and it is possible to make the conductive layer function as a shield case with the other area having conductivity.

Next, as shown in FIG. 2, at a position opposite to the rigid substrate 22 side with respect to the case body 24, the key sheet 30 is arranged in parallel with the flat plate part 25 of the case body 24 with the key FPC 28 (to be described later) between the key sheet 30 and the case body 24. The key sheet 30 is configured in such a manner that a plurality of key tops 80 are bonded on a sheet 78 made of silicone rubber.

As shown in FIG. 1, in the upper case 18 of the second housing 8, a plurality of key holes 82 are formed on an operation surface 81 opposing the display screen of the display unit 10 when both the first housing 6 and the second housing 8 are folded. A surface to be pressed in each of the key tops 80 of the key sheet 30 for allowing a finger of a hand, or the like to contact is exposed to the outside from each key hole 82. Then, when the surface in the key top 80 is pressed by a finger of a hand, or the like, the reverse side of the pushed surface presses a corresponding key switch 48 (to be described later).

Furthermore, as shown in FIG. 2, the key FPC 28 is arranged in such a manner as to be sandwiched between the flat plate part 25 of the case body 24 and the key sheet 30. In the key FPC 28, a first surface 28a on the upper case 18 side is provided with a plurality of key switches 48, and a second surface 28b opposite to the first surface 28a is placed on the flat plate part 25 of the case body 24.

Figure 6:
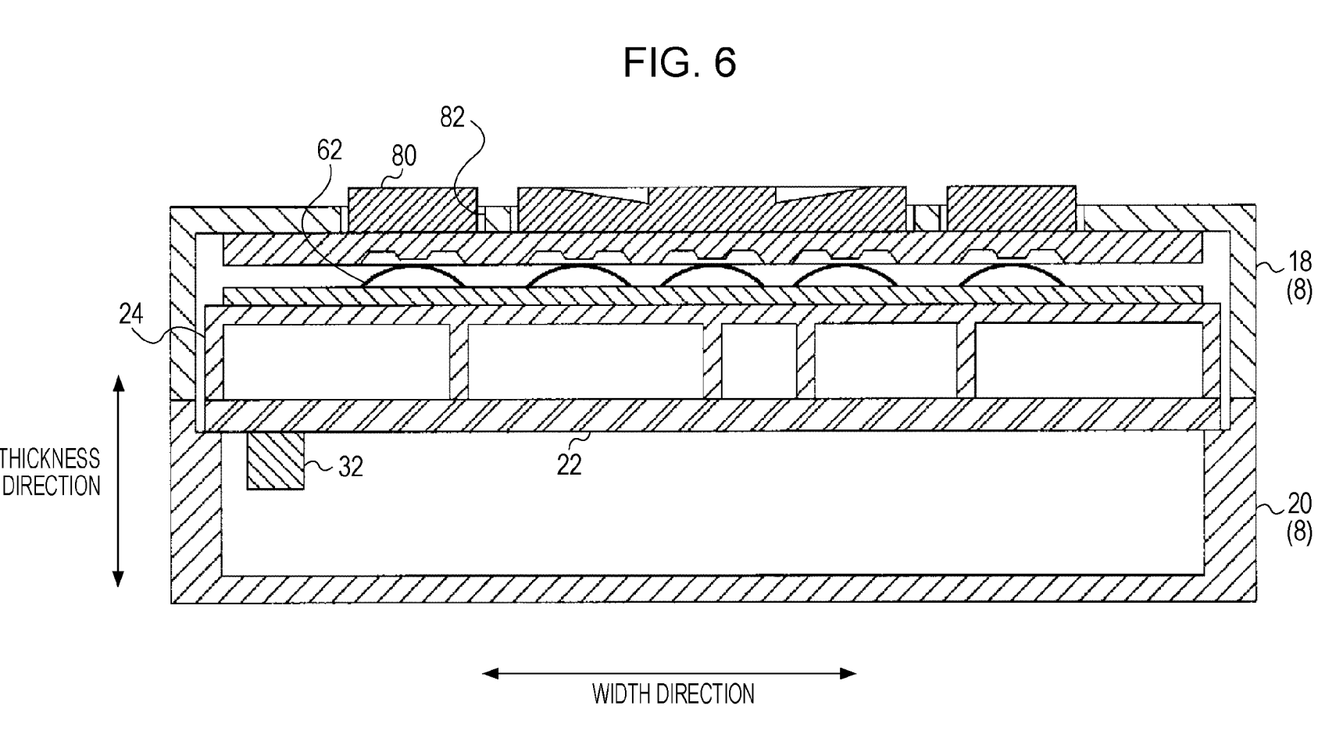
FIG. 6 is a view taken along line C-C of the second housing 8, showing a state in which the upper case 18 and the lower case 20 of the second housing 8, the rigid substrate 22, the case body 24, the key FPC 28, the key sheet 30, and the antenna 32, shown in FIG. 2, are assembled.

The key switch 48 of the key FPC 28 has a structure including a metal dome 62 of a metal plate curved in a bowl shape in three dimensions. When the apex in the form of a bowl of the metal dome 62 is pressed, the metal dome 62 contacts a switch terminal of an electric circuit (not shown) printed on the key FPC 28 to be electrically connected to each other. as shown in FIG. 6, the metal dome 62 is positioned so that the metal dome 62 does not overlap the antenna 32 in the thickness direction of the rigid substrate 22.

According to the folding-type mobile phone 2, the case body 24, and the method of manufacturing the case body 24, described above, in accordance with this embodiment, since a conductive layer is not formed in the antenna opposing area S of the flat plate part 25 of the case body 24, it is possible to prevent the gain of the antenna 32 from being deteriorated.

Furthermore, even if the metal dome 62 having conductivity is arranged in the antenna opposing area S, an adverse influence on radio-wave radiation characteristics of the antenna 32 is reduced except for the position overlapping just above the antenna 32. As a consequence, it becomes possible to arrange the key switch 48 over approximately the entire area of the case body 24, and it is possible to improve the ease of operation of the folding-type mobile phone 2.

Furthermore, in the case body 24, the rib 26 is not formed in the section of the flat plate part 25. The section corresponds to the side other than the three sides corresponding to the ribs 26a, 26b, and 26c among the four sides of the peripheral edge of the antenna opposing area S. As a consequence, a masking operation for preventing a conductive layer from being formed in the antenna opposing area S can be facilitated.

That is, the rib 26 is not formed in the section, which is in the peripheral edge of the antenna opposing area S and which is parallel to the width direction of the case body 24. as a consequence, when a tape for masking is attached along the length direction of the case body 24 or when a paint for masking is applied on the surface on the rigid substrate 22 side (in FIG. 5, the front side at right angles to the paper surface) of the antenna opposing area S, obstacles to operations for taping or applying a paint are reduced, and these operations can be easily performed.

For example, as such a tape for masking, a planar tape formed such that the length corresponding to the thickness of the flat plate part 25 is added to become integrally continuous in a direction connecting two planar shapes corresponding to the respective surfaces of the obverse and reverse surfaces of the antenna opposing area S is provided in advance. By using the non-rib side of the antenna opposing area S, this tape can be attached from the obverse surface to the reverse surface through the side surface of the case body 24. That is, according to the case body 24 in accordance with this embodiment, it is possible to easily perform masking by using such the single tape. Furthermore, when the mask is removed after the conductive layer is formed, this single tape need only to be peeled off, thereby improving the ease of operation.

According to the folding-type mobile phone 2, the case body 24, and the method of manufacturing the case body 24 in accordance with this embodiment, the antenna opposing area S has ribs 26a, 26b, and 26c provided at a place other than one non-rib side of the peripheral edge portion, which is used during masking. As a consequence, even if, in the key sheet 30, the key top 80 arranged on the antenna opposing area S is pressed, and then the metal dome 62 is pressed, the case body 24 can obtain the strength to make the ribs prop to the substrate and (can obtain) the strength to keep a clearance.

Furthermore, the case body 24 of the folding-type mobile phone 2 has the flat plate part 25 whose entire surface on the upper case 18 side (in FIG. 5, the inner part at right angles to the paper surface) is almost flat. As a consequence, when the key top 80 is to be laid out within the planar area of the key sheet 30 arranged on the flat plate part 25, there is no need to pay attention to obstacles, such as a step difference. Therefore, it is possible to improve the degree of freedom of the layout of the key top 80.

Furthermore, since the folding-type mobile phone 2 has the key FPC 28 whose the metal dome 62 is positioned so that the metal dome 62 does not overlap the antenna 32 in the thickness direction of the rigid substrate 22, it is possible to prevent the gain of the antenna 32 from being deteriorated.

Next, with reference to FIGS. 1, 2, and 7, a folding-type mobile phone 90 (corresponding to a wireless communication terminal), a case body 92, and a method of manufacturing the case body 92 according to a second embodiment of the present invention will be described.

As shown in FIG. 1, the folding-type mobile phone 90 according to this embodiment includes a first housing 6 and a second housing 8 similarly to the folding-type mobile phone 2 according to the first embodiment. In the space between an upper case 18 and a lower case 20 of the second housing 8, as shown in FIG. 2, also, a rigid substrate 22, a key FPC 28, and a key sheet 30, which are identical to those of the folding-type mobile phone 2 according to the first embodiment, are housed.

Figure 7:
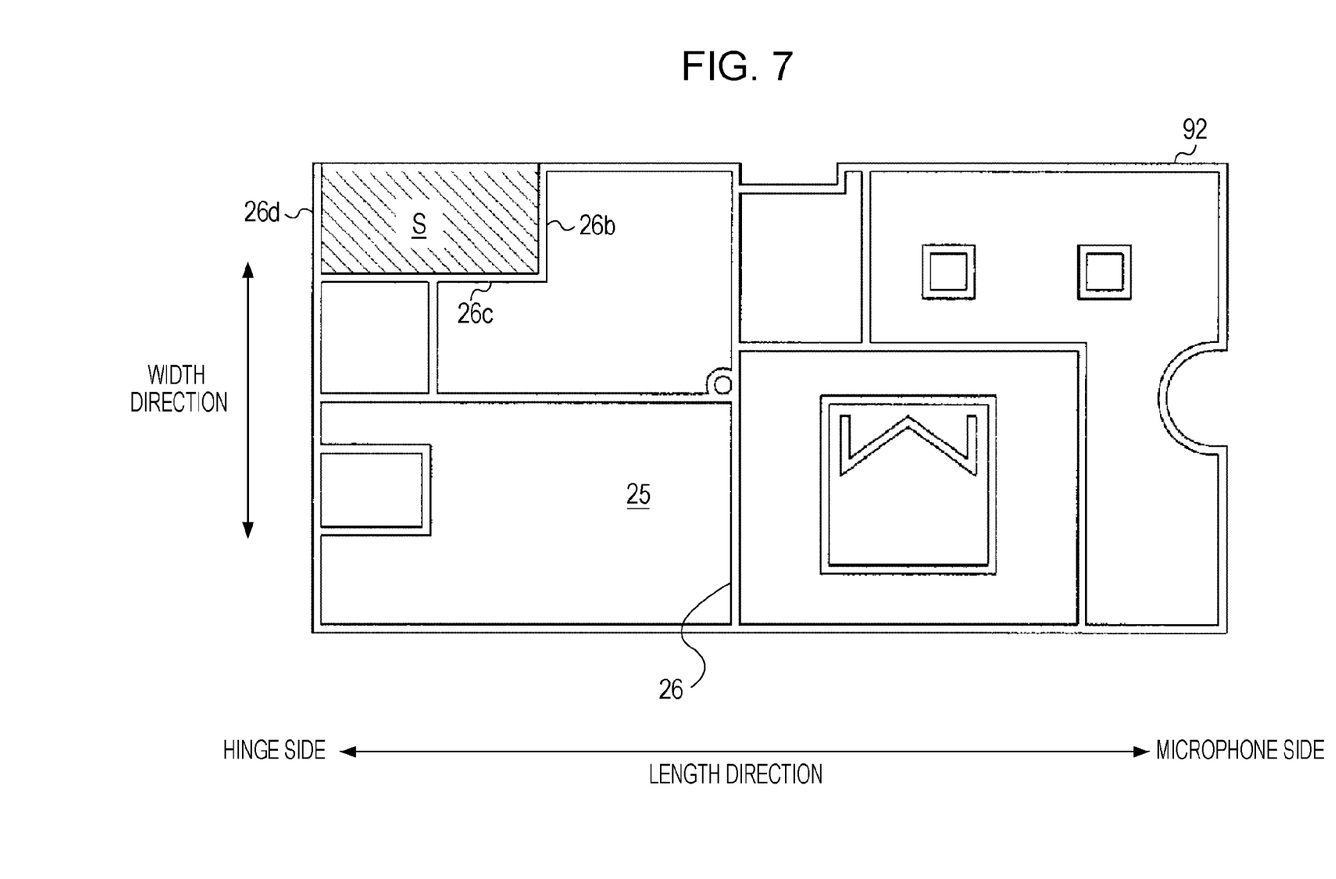
FIG. 7 is a plan view when viewed from the rigid substrate 22 side of a case body 92 of the folding-type mobile phone 90 according to a second embodiment.

In the folding-type mobile phone 90 according to this embodiment, the case body 92 shown in FIG. 7 is provided in place of the case body 24 of the folding-type mobile phone 2 according to the first embodiment.

In the peripheral edge of the antenna opposing area S in the flat plate part 25 of the case body 92, a rib 26d formed in the edge portion of the flat plate part 25 in parallel with the width direction of the flat plate part 25, and a rib 26b formed in parallel with the width direction of the flat plate part 25 and a rib 26c formed in parallel with the length direction of the flat plate part 25 inside the planar flat plate part 25 are arranged. The rib 26 is not formed in a section of the flat plate part 25. The section corresponds to the side other than the three sides corresponding to the ribs 26b, 26c, and 26d among the four sides of the peripheral edge of the antenna opposing area S.

According to the folding-type mobile phone 90, the case body 92 and the method of manufacturing the case body 92, described above, in accordance with this embodiment, similarly to the first embodiment, a conductive layer is not formed in the antenna opposing area S of the flat plate part 25 of the case body 92, and therefore, it is possible to prevent the gain of the antenna 32 from being deteriorated.

Furthermore, as long as the position overlapping just above the antenna 32 is excluded, even if the metal dome 62 having conductivity is arranged in the antenna opposing area S, it is difficult to exert an adverse influence on radio-wave radiation characteristics of the antenna 32. As a consequence, it becomes possible to arrange the key switch 48 over approximately the entire area of the case body 92, and it is possible to improve the ease of operation of the folding-type mobile phone 90.

Furthermore, the rib 26 is not formed in the section of the flat plate part 25. The section corresponds to the side other than the three sides corresponding to the ribs 26b, 26c, and 26d among the four sides of the peripheral edge of the antenna opposing area S. As a consequence, it is possible to easily perform a masking operation for preventing a conductive layer from being formed in the antenna opposing area S.

According to the folding-type mobile phone 90, the case body 92, and the method of manufacturing the case body 92 in accordance with this embodiment, the antenna opposing area S has the ribs 26b, 26c, and 26d provided at a place other than the non-rib side of the peripheral edge portion, which is used during masking. As a consequence, even if, in the key sheet 30, the key top 80 arranged in the antenna opposing area S is pressed and the metal dome 62 is depressed, in the case body 92 just below, the ribs 26b, 26c, and 26d prop up the rigid substrate 22, and sufficient strength to continue to maintain a constant clearance between the flat plate part 25 of the case body 92 and the rigid substrate 22 can be obtained.

Furthermore, the case body 92 of the folding-type mobile phone 90, similarly to the first embodiment, has the flat plate part 25 whose entire surface on the upper case 18 side (in FIG. 7, the inner part at right angles to the paper surface) is almost flat. As a consequence, when the key top 80 is to be laid out within the planar area of the key sheet 30 arranged on the flat plate part 25, there is no need to pay attention to obstacles, such as a step difference. Therefore, it is possible to improve the degree of freedom of the layout of the key top 80.

Furthermore, similarly to the first embodiment, since the folding-type mobile phone 90 has the key FPC 28 whose the metal dome 62 is positioned so that the metal dome 62 does not overlap the antenna 32 in the thickness direction of the rigid substrate 22, it is possible to prevent the gain of the antenna 32 from being deteriorated.

Next, with reference to FIGS. 1, 2, and 8, a folding-type mobile phone 95 (corresponding to a wireless communication terminal), a case body 97, and a method of manufacturing the case body 97 according to a third embodiment of the present invention will be described.

Figure 8:
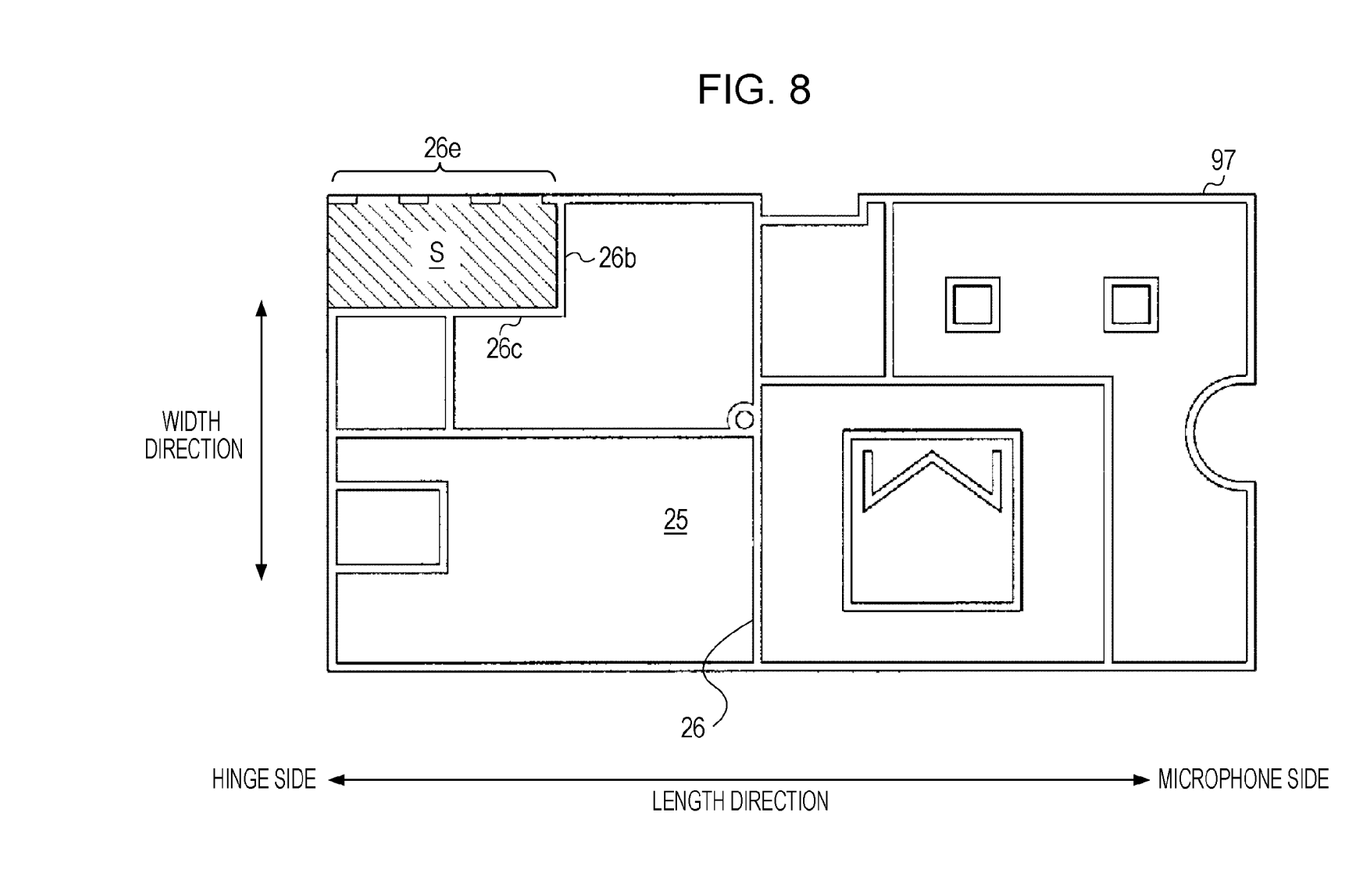
FIG. 8 is a plan view when viewed from the rigid substrate 22 side of a case body 97 of the folding-type mobile phone 95 according to a third embodiment.

The folding-type mobile phone 95 according to this embodiment includes the case body 97 shown in FIG. 8 in place of the case body 24 of the folding-type mobile phone 2 according to the first embodiment.

In the peripheral edge of the antenna opposing area S in the flat plate part 25 of the case body 97, a rib 26e that is intermittently formed in the edge portion of the flat plate part 25 in parallel with the length of the flat plate part 25, and a rib 26b formed in parallel with the width of the flat plate part 25 inside the planar flat plate part 25 and a rib 26c formed in parallel with the length of the flat plate part 25 inside the planar flat plate part 25 are arranged. Then, the rib 26 is not formed in a section of the flat plate part 25. The section corresponds to the side other than the three sides corresponding to the rib 26b, 26c, 26e among the four sides of the peripheral edge of the antenna opposing area S.

According to the folding-type mobile phone 95, the case body 97, and the method of manufacturing the case body 97, described above, in accordance with this embodiment, similarly to the first and second embodiments, a conductive layer is not formed in the antenna opposing area S of the flat plate part 25 of the case body 97, and therefore, it is possible to prevent the gain of the antenna 32 from being deteriorated.

Furthermore, as long as the position overlapping just above the antenna 32 is excluded, even if the metal dome 62 having conductivity is arranged in the antenna opposing area S, it is difficult to exert an adverse influence on radio-wave radiation characteristics of the antenna 32. As a consequence, it becomes possible to arrange the key switch 48 over approximately the entire area of the case body 97, and it is possible to improve the ease of operation of the folding-type mobile phone 95.

Furthermore, the case body 97 has an intermittent rib 26e at a region which is in a first section parallel to the length of the flat plate part 25, which is in the peripheral edge of the flat plate part 25, and which is in the peripheral edge of the antenna opposing area S. In addition, the case body 97 has no rib 26 in second section in parallel with the width direction. As a result, similarly to the first and second embodiments, a masking operation for preventing a conductive layer from being formed in the antenna opposing area S can be facilitated.

According to the folding-type mobile phone 95, the case body 97, and the method of manufacturing the case body 97 in accordance with this embodiment, the antenna opposing area S has the ribs 26b, 26c, and 26e provided at a place other than non-rib side of the peripheral edge portion, which is used during masking. As a consequence, even if, in the key sheet 30, the key top 80 arranged on the antenna opposing area S is pressed and then the metal dome 62 is pressed, the case body 97 just below can obtain the sufficient strength to make the ribs 26b, 26c, and 26e prop up the rigid substrate 22, and the sufficient strength to continue to maintain a constant clearance between the flat plate part 25 of the case body 97 and the rigid substrate 22 can be obtained.

According to the folding-type mobile phone 95, the case body 97, and the method of manufacturing the case body 97 in accordance with this embodiment, the intermittent rib 26e is formed in the peripheral edge portion of the antenna opposing area S. Therefore, when masking is to be performed in the antenna opposing area S by using a paint for masking, the paint for masking can be consecutively applied on the obverse and reverse surfaces through the intermittent space portions of the rib 26e, or the mask of the obverse and reverse surfaces can be peeled off consecutively. While the ease of operation of masking is increased, the prop force of the rib 26e with respect to the rigid substrate 22 can be ensured. Therefore, in the key sheet 30, it is possible to prevent the strength against pressing the key top 80 arranged on the antenna opposing area S from being decreased.

Furthermore, the case body 97 of the folding-type mobile phone 95, similarly to the first and second embodiments, has the flat plate part 25 whose entire surface on the upper case 18 side (in FIG. 8, the inner part at right angles to the paper surface) is almost flat. As a consequence, when the key top 80 is to be laid out within the planar area of the key sheet 30 arranged on the flat plate part 25, there is no need to pay attention to obstacles, such as a step difference. Therefore, it is possible to improve the degree of freedom of the layout of the key top 80.

Furthermore, similarly to the first and second embodiments, since the folding-type mobile phone 95 has the key FPC 28 whose the metal dome 62 is positioned so that metal dome 62 does not overlap the antenna 32 in the thickness direction of the rigid substrate 22, it is possible to prevent the gain of the antenna 32 from being deteriorated.

In the first to third embodiments, as shown in FIG. 3, the antenna 32 is arranged in an end portion on the hinge 4 side in the length direction of the rigid substrate 22 (in the direction connecting the hinge 4 side to the microphone 16 side) and is arranged in one of the end portions in the width of the rigid substrate 22. Alternatively, the antenna 32 may be arranged in an end portion on the hinge 4 side or the microphone 16 side in the length direction of the rigid substrate 22 and at any position in the width direction. Furthermore, the antenna 32 may be arranged in one of the end portions in the width direction of the rigid substrate 22 and at any position in the length direction.

In such a case, also, in the antenna opposing area S of the flat plate part 25 of the case bodies 24, 92, and 97, which corresponds to the position of the antenna 32, similarly to the first to third embodiments, of course, a conductive layer is not formed, and the rib 26 is not formed in the second section of the peripheral edge of the antenna opposing area S.

Furthermore, in the third embodiment, as shown in FIG. 8, the rib 26 is not formed in the second section of the flat plate part 25 corresponding to the non-rib side other than the three sides corresponding to the rib 26b, 26c, 26e among the four sides of the peripheral edge of the antenna opposing area S. Alternatively, in the second section, a rib 26d identical to the case body 92 (see FIG. 7) of the folding-type mobile phone 90 according to the second embodiment may be provided.

Furthermore, in the first to third embodiments, the rigid substrate 22 and the case bodies 24, 92, and 97 are housed inside the second housing 8. Alternatively, these may be housed inside the first housing 6.

Furthermore, in the first to third embodiments, the case bodies 24, 92, and 97 have a structure comprising the flat plate part 25 and the rib 26. However, the case bodies 24, 92, and 97 are not limited to the structure as above. For example, the case bodies 24, 92, and 97 may have a plate part having a curvature, a step difference, or the like in place of the flat plate part 25. Furthermore, the case bodies 24, 92, and 97 may have, in place of the rib 26, a plurality of struts having the same height as the rib 26, and the tip end surface of the strut may be mounted on the rigid substrate 22 in such a manner as to be in abutment with the second surface 22b of the rigid substrate 22.

Furthermore, in this embodiment, a case in which the present invention is applied to the folding-type mobile phone 2 has been described. Of course, the present invention can be applied to other wireless communication terminals, such as a mobile phone other than the folding-type mobile phone 2. The present invention can be applied to other wireless communication terminals such as a PHS (Personal Handyphone System), a PDA (Personal Digital Assistant), and a portable navigation apparatus.

The present invention is not limited to the above-described embodiments and includes many more changes and modifications without departing from the spirit and scope of the invention.

The present application is based on Japanese Patent Application No. 2005-279423 filed on Sep. 27, 2005, the contents of which are incorporated herein by reference.

The invention claimed is:

1. A wireless communication terminal comprising:
   a first circuit substrate having an antenna disposed on a first surface thereof and an electronic component disposed on a second surface thereof;
   a case molded of a non-conductive material, the case being attached to the first circuit substrate so that the case overlaps the first circuit substrate in the thickness direction of the first circuit substrate; and
   a housing including the first circuit substrate and the case therein, wherein the case comprises a conductive layer on a surface thereof, the surface being except for an antenna opposing area where the case overlaps the antenna in the thickness direction of the first circuit substrate, a flat plate part parallel to the first circuit substrate in a state in which the case is attached to the first circuit substrate, the flat plate part containing the antenna opposing area, and a rib formed to have a height in a direction from the flat plate part to the first circuit substrate side, wherein the rib connects the flat plate part and the first circuit substrate.

2. The wireless communication terminal according to claim 1, further comprises a key sheet having a key top, disposed at a position opposite to the first circuit substrate side of the flat plate part.

3. The wireless communication terminal according to claim 2, further comprises a second circuit substrate having a metal dome to be pressed by the key top, the second circuit substrate being arranged between the key sheet and the flat plate part, wherein the metal dome is positioned so that the metal dome does not overlap the antenna in the thickness direction of the first circuit substrate.

4. The wireless communication terminal according to claim 1, wherein the case body further comprises:

a flat plate part and a rib formed to have a height in a direction from the flat plate part to one of the surface sides, the rib comprising a non-conductive material, wherein the flat plate part and the rib comprise a conductive layer formed thereon, except for at least a predetermined area.

5. The wireless communication terminal according to claim 4, wherein the flat plate part and the rib are integrally formed.

6. The wireless communication terminal according to claim 1, wherein the antenna opposing area is a part of the case and is made of the non-conductive material.

7. The wireless communication terminal according to claim 1, wherein the antenna opposing area is located on a second surface of the case opposite to a first surface which is closer to the antenna than the second surface.

8. The wireless communication terminal according to claim 1, wherein the conductive layer is located on a second surface of the case opposite to a first surface of the case opposite wherein the first surface is closer to the antenna than the second surface.

9. The wireless communication terminal according to claim 1, wherein the case comprises at least two sides and further comprising a metal conductive layer on at least two sides of the case.

10. The wireless communication terminal according to claim 9, wherein the case further comprises an antenna opposing area having no metal conductive layer on at least two sides of the case.

11. The wireless communication terminal according to claim 1, wherein the first circuit substrate has a first side and a second side and the antenna is arranged on the first side of the first circuit substrate and wherein the first side of the first circuit substrate is closer to the case than the second side of the first circuit substrate.

12. The wireless communication terminal according to claim 1, wherein the rib is not formed in at least the peripheral edge of the antenna opposing area.

13. The wireless communication terminal according to claim 1, wherein the rib is formed intermittently in at least the peripheral edge of the antenna opposing area.

\* \* \* \* \*